United States Patent [19]

Yamamoto et al.

[11] Patent Number: 4,737,962
[45] Date of Patent: Apr. 12, 1988

[54] COMPOUND RESONATOR TYPE SEMICONDUCTOR LASER DEVICE

[75] Inventors: Saburo Yamamoto, Nara; Hiroshi Hayashi, Kyoto; Nobuyuki Miyauchi, Nara; Shigeki Maei, Nara; Taiji Morimoto, Nara, all of Japan

[73] Assignee: Sharp Kabushiki Kaisha, Osaka, Japan

[21] Appl. No.: 734,091

[22] Filed: May 15, 1985

[30] Foreign Application Priority Data

May 16, 1984 [JP] Japan .................................. 59-99319
May 23, 1984 [JP] Japan ................................ 59-105373

[51] Int. Cl.⁴ .......................... H01S 3/19; H01S 3/10
[52] U.S. Cl. ........................................ 372/49; 372/26; 372/46; 372/50; 372/97
[58] Field of Search ...................... 372/49, 48, 45, 46, 372/26, 97, 50

[56] References Cited

U.S. PATENT DOCUMENTS 4,219,785 8/1980 Scifres et al. ......................... 372/46
4,337,443 6/1982 Umeda et al. ........................ 372/49
4,347,612 8/1982 Fekete et al. ........................ 372/46
4,599,729 7/1986 Sasaki et al. ......................... 372/49

FOREIGN PATENT DOCUMENTS 47601 3/1982 European Pat. Off. .
3006949 9/1980 Fed. Rep. of Germany .

OTHER PUBLICATIONS

Fattah and Wang, "Semiconductor Interferometric Laser", 1982, pp. 112-114, *Appl. Phys. Lett.* 41 (2).
Fattah and Wang, "Tuning of Semiconductor Interferometric Laser", IOOC, 1983 Digest, pp. 196-197.
Arsam Antreasyan et al., *Applied Physics Letters*, vol. 43, pp. 530-532 (1983).
Motoichi Ohtsu et al, *Japanese Journal of Applied Physics*, vol. 22, pp. 815-820 (1983).
Ismail H. A. Fattah et al., *Applied Physics Letters*, vol. 41, pp. 112-114 (1982).
Shyh Want et al., IEEE *Translations on Quantum Electronics*, vol. QE-19, pp. 610-617 (1982).
Arsam Antreasyan et al., *Applied Physics Letters*, vol. 42, pp. 562-564 (1983).

*Primary Examiner*—James W. Davie
*Assistant Examiner*—Georgia Y. Epps
*Attorney, Agent, or Firm*—Spencer & Frank

[57] ABSTRACT

A compound resonator type semiconductor laser device comprising a multiple-layered crystal structure having a first laser operation area which contains a resonator for laser oscillation and a second laser operation area which contains a resonator a facet of which is shared with that of the resonator in the first laser operation area; and an electric current feeder for injecting a current into said multiple-layered crystal structure, and wherein said facet of the resonator in the first laser operation area, which is shared with the facet of the resonator in the second laser operation area, is covered with a protective film to attain a high reflectivity therein, the other facet of the resonator in the first laser operation area is covered with a protective film to attain a low reflectivity therein, and the other facet of the resonator in the second laser operation area is covered with a protective film to attain a high reflectivity therein.

5 Claims, 3 Drawing Sheets

4,737,962

COMPOUND RESONATOR TYPE SEMICONDUCTOR LASER DEVICE

BACKGROUND OF THE INVENTION

1. Field of the Invention

This invention relates to a compound resonator type semiconductor laser device having a structure which is effective to attain a stabilized oscillation wavelength.

2. Description of the prior art

Semiconductor laser devices directed toward mass production can attain laser oscillation at a low threshold current level and obtain considerably satisfactory results in characteristics such as the single transverse mode, the single longitudinal mode, durability, etc., but they have problems with regard to a stabilized oscillation wavelength (i.e., the stabilized lonitudinal mode) in that the oscillation wavelength varies continuously or discontinuously depending upon a variation in temperature and/or electric current, resulting in optical output noise which is noticeable when the laser device is exposed to light and/or a reflected laser light (i.e., backlight) from the laser device is incident upon the laser device. In order to eliminate these problems, distributed feedback (DFB) type lasers and compound resonator type lasers have been developed to try to stabilize the oscillation wavelength. However, these laser devices cannot attain a stabilized oscillation wavelength in a wide range of temperature and is insufficient to prevent noise derived from the backlight.

FIG. 8 shows a conventional compound resonator type laser device which comprises an n-substrate 1, an n-cladding layer 2, an active layer 3, a p-cladding layer 4, a p-cap layer 5, a current blocking oxide film 6, a first laser operation area 7 with a resonator length of $(L_1+L_2)$ having a striped window region, and a second laser operation area 8 with the resonator length of $(L_1+L_3)$ having a striped window region, thereby effecting an optical interference between these two laser operation areas 7 and 8 to produce a stabilized oscillation wavelength (stabilized longitudinal mode). The interval $\Delta\lambda_1$ of the longitudinal mode in the first laser operation area 7 is proportional to $\lambda_{02}/2\bar{n}(L_1+L_2)$, while the interval $\Delta\lambda_2$ of the longitudinal mode in the second laser operation area 8 is proportional to $\lambda_{02}/2\bar{n}(L_1+L_3)$, wherein $\lambda_0$ is the oscillation wavelength and n is the refractive index of the active layer 3. Due to the interference between the longitudinal modes in the laser operation areas 7 and 8, a wide interval $\Lambda(=\lambda_{02}/2\bar{n}|L_3-L_2|)$ of the longitudinal mode is created resulting in stabilized laser oscillation in the longitudinal mode alone around the peak of the gain distribution. However, it is difficult to form the facets with the optimum length of each of $L_1$, $L_2$ and $L_3$ in such a conventional compound resonator type laser device by a cleavage technique, so that the longitudinal mode cannot be stabilized in a wide range of temperature, but it is stabilized ranging in temperature from 5° to 10° C. at the widest. Moreover, a conventional compound resonator type laser device cannot suppress the unstabilized longitudinal mode resulting from backlight therefrom.

On the other hand, semiconductor lasers have been used in the amplitude modulation (AM) format as a light source for optical communication. However, the frequency modulation (FM) format is advantageous over the amplitude modulation (AM) format in attainment of capacious and rapid optical communication, so that frequency modulating semiconductor laser devices which can effect frequency modulation in a wide range and have the great modulation degree are anxiously expected to be established in the field of communication technologies.

FIG. 9 shows a conventional compound resonator used as a frequency modulating semiconductor laser device which comprises a Fabry-Pérot resonator type semiconductor laser operation area 100 having a rectilinear resonator therein with the resonator length of $(L_1+L_2)$, a modulation area 200 having an L-shaped resonator therein with the resonator length of $(L_1+L_3)$, a separation groove 30 to electrically separate the waveguide in the semiconductor laser operation area 100 from the waveguide in the modulation area 200, and facets 40, 50 and 60 which are formed by a cleavage technique to constitute the Fabry-Pérot resonators. The facet 40 is common to both the resonators in the semiconductor laser operation area 100 and in the modulation area 200. When the electric currents $I_1$ and $I_2$ flows into the semiconductor laser operation area 100 and the modulation area 200, respectively, laser oscillation is produced as shown by the arrow marks in FIG. 9. A variation of the electric current $I_2$ flowing into the modulation area 200 allows a continuous variation of the oscillation wavelength with which a laser light in the single longitudinal mode results from the interference between the two resonators. However, this conventional laser device has an extremely limited wavelength modulation range to the extent of tens of Å, resulting in a modulation degree of as low as approximately 1 Å/mA so that a sufficient modulation effect cannot be attained.

SUMMARY OF THE INVENTION

The compound resonator type semiconductor laser device of this invention which overcomes the above-discussed disadvantages and other numerous defficiencies and drawbacks, comprises a multiple-layered crystal structure having a first laser operation area which contains a resonator for laser oscillation and a second laser operation area which contains a resonator a facet of which is shared with that of the resonator in the first laser operation area; and an electric current feeder for injecting a current into said multiple-layered crystal structure, wherein said facet of the resonator in the first laser operation area, which is shared with the facet of the resonator in the second laser operation area, is covered with a protective film to attain a high reflectivity therein, the other facet of the resonator in the first laser operation area is covered with a protective film to attain a low reflectivity therein and the other facet of the resonator in the second laser operation area is covered with a protective film to attain a high reflectivity therein.

The protective film attaining a high reflectivity is a lamination composed of alternate layers of a dielectric film and an amorphous silicon film having a thickness of $\lambda/4$ each and the protective film attaining a low reflectivity is a single layer of a dielectric film having a thickness in the range from $\lambda/4$ to $\lambda/2$. The dielectric film is made of $SiO_2$ or $Al_2O_3$.

The second laser operation area functions as a modulation area for the modulating frequency. A separation groove is disposed in at least one of the upper and the bottom electrodes formed on said multiple-layered crystal structure to electrically separate said laser operation area from said modulation area.

Thus, the invention described herein makes possible the objects of (1) providing a novel compound resonator type semiconductor laser device which attains laser oscillation with a stabilized oscillation wavelength in a wide range of temperature; (2) providing a novel compound resonator type semiconductor laser device which can suppress noise due to backlight; and (3) providing a novel compound resonator type semiconductor laser device which can modulate the frequency in a significantly wide range thereby effecting the great degree of modulation.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

1. Compound resonator type semiconductor laser devices:

Each of the facets releasing a laser light of the compound resonator type semiconductor laser device is covered with a dielectric film having a given thickness to thereby have a selected reflectivity with regard to the oscillation wavelength $\lambda$, that is, a low reflectivity is selected for one of the facets of the resonator in a first laser operation area for releasing a laser light, while a high reflectivity is selected for the other facet of the resonator in the first laser operation area and for both facets of the resonator in a second laser operation area, one of which is common to the other facet in the first laser operation area. For example, the facet requiring a low reflectivity is covered with a single layer such as a dielectric film made of $SiO_2$, $Al_2O_3$ or the like, having a thickness in the range of from one fourth to one half of the oscillation wavelength $\lambda$, resulting in a modulation degree ranging from 0 to approximately 0.32. The facets requiring a high reflectivity are covered with a lamination composed of alternate layers of a dielectric film made of $SiO_2$, $Al_2O_3$ or thel ike, and an amorphous silicon (a - Si) film, each of which has a thickness of $\lambda/4$, resulting in a modulation degree ranging from 0.32 to 1.00.

Figure 8:
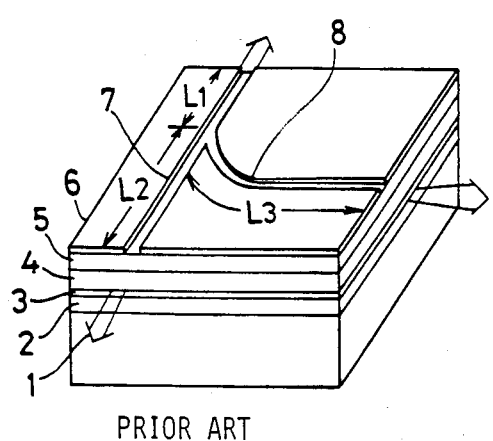
FIG. 8 is a perspective view of a conventional compound resonator type semiconductor laser device.

When a driving current is injected into both the laser operation areas and exceeds the sum of the threshold current for laser oscillation in each of the laser operation areas, each of the resonators attains laser oscillation. Since both the facets fo the resonator in the second laser operation area have a high reflectivity, most of the laser light is confined within the resonator without oscillating to the outside so that the internal photon density of the resonator increases. On the contrary, since the facet of the resonator in the first laser operation area has a low reflectivity, a large portion of the laser light is released from the facet alone so that the internal photon density of the resonator is reduced. That is, one of the resonators has a high photon density in the vicinity of the facet which is common to that of the other resonator, while the other resonator has a low photon density in the vicinity of the facet releasing a laser light. This means that the resonator oscillating a laser light in one of the laser operation areas has a waveguide having different photon densities. Thus, the resonator of this invention is different from the conventional resonator shown in FIG. 8 in the carrier density, the refractive index and the gain curve and accordingly the laser light having a wavelength which has been selected to minimize waveguide losses is channeled therefrom.

As mentioned above, the compound resonator type semiconductor laser device of this invention is designed to select the oscillation wavelength based on the difference between the internal photon densities of the resonators, although the conventional compound resonator type semiconductor laser device is designed to select the oscillation wavelength based on the difference between the resonator lengths, resulting in a stabilized longitudinal mode in a wide range of temperature and a stabilized output power without the influence of backlight.

Example

Figure 1:
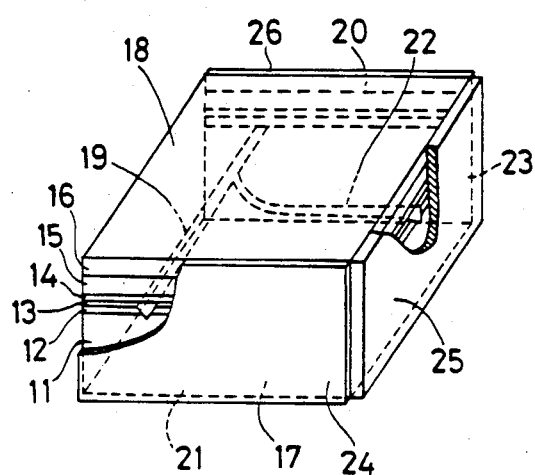
FIG. 1 is a perspective view of a compound resonator type semiconductor laser device according to this invention.
Figure 2:
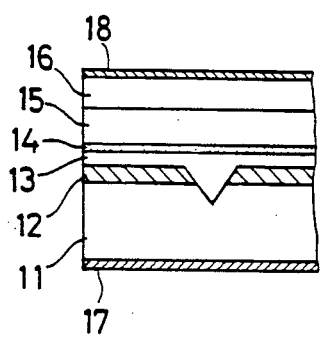
FIG. 2 is a partial sectional front view of the semiconductor laser device shown in FIG. 1.

FIGS. 1 and 2 show a VSIS (V-channeled substrate inner stripe) laser device of refractive index waveguide type as a compound resonator type semiconductor laser device, which is produced as follows:

On a p-GaAs substrate 11, an n-GaAs current blocking layer 12 is disposed and etched to form a V-shaped stripe channel reaching the GaAs substrate 11, resulting in an electroconductive region. On the current blocking layer 12, a p-$Ga_{1-y}Al_yAs$ cladding layer 13, a p-(or a nondoped n-) $Ga_{1-x}Al_xAs$ active layer 14, an n-$Ga_{1-y}Al_yAs$ cladding layer 15 and an n-GaAs cap layer 16 are successively disposed resulting in a double heterostructure for laser oscillation in which the active layer 14 is endowed with the distribution of refractive index. The parameters x and y in the mixed crystal ration are 0.05 and 0.3, respectively.

Then, the back of the GaAs substrate 11 and the surface of the cap layer 16 are subjected to a vacuum evaporation treatment with metal materials of Au-Zn and Au-Ge-Ni, respectively, followed by heating to form an electrode 17 made of an alloy of Au-Zn and an electrode 18 made of an alloy of Au-Ge-Ni, respectively.

The striped channel consists of a rectilinear channel, which runs between the back facet 20 and the front facet 21 in the multiple layered structure, and a L-shaped channel, which branches off in the middle course of the rectilinear channel and runs with a gently curve between the back facet 20 and the side facet 23. The first laser operation area 19 containing a resonator therein for laser oscillation is formed within the active layer 14 at the upper position corresponding to the rectilinear striped channel. The second laser operation area 22 containing a resonator therein is formed within the active layer 14 at the upper position corresponding to the L-striped channel. One of the facets of the resonator in the second laser operation area 22 is common to the back facet 20 in the first laser operation area 19. Also, the waveguide in the second laser operation area 22 is common to that in the first laser operation area 19 from the back facet 20 to the branching portion of the L-striped channel. The side facet 23, at which the end of the L-striped channel is located, is positioned at a right angle to the back facet 20.

The waveguide in each of the laser operation areas 19 and 22 is preferably of a refractive index waveguide type which is advantageous over a gain waveguide type in that a single longitudinal mode can be readily attained. Each of the facets 20, 21 and 23 of the resonators in the laser operation areas 19 and 22 is covered with a protective film to effect a selected reflectivity. The front facet 21 for releasing a laser light in the first laser operation area 19 is covered with a single layer 24 of $Al_2O_3$ having a thickness of approximately $\lambda/2$ ($\lambda$ is the oscillation wavelength) by an electron beam vapor deposition method, resulting in a reflectivity of as low as about 0.32. The other facet 20 in the first laser operation area 19 is covered with a lamination 26 consisting of four alternate layers of an $Al_2O_3$ layer and an a-Si layer each of which has a thickness of $\lambda/4$ by an electron beam vapor deposition method, resulting in a reflectivity of as high as about 0.95. The facet 23 in the second laser operation area 22 is also covered with a lamination 25 attaining a high reflectivity which is of the same construction as the lamination 26 on the facet 20.

When a DC current is injected into the resulting laser device through the electrodes 17 and 18, the current flows through the striped channel in the GaAs substrate 11 to allow laser oscillation in the laser operation areas 19 and 22 within the active layer 14 at the upper portion corresponding to the striped channel. The injected current is contracted by the striped channel and a light is confined within the laser operation areas 19 and 20 due to the distribution of the effective refraction index. A concentrated laser light is oscillated in a spotlight fashion in the stabilized transverse mode from the facet depending upon the reflectivity thereof. No laser light is oscillated from either the back facet 20 or the side facet 23 in the second laser operation area 22 because of their high reflectivity, so that the internal photon density in the area around the facets 20 and 23 increases extremely at laser oscillation, while the laser light is mainly oscillated from the front facet 21 in the first laser operation area 19 because of the low reflectivity thereof so that the internal photon density in the area around the front facet 21 is reduced. As a result, the resonator in the first laser operation area 19 is composed of the high photon density region ranging from the back facet 20 in common with that in the second laser operation area 22 to the branching portion in the resonator in the second laser operation area 22 and the low photon density region ranging from the branching portion to the front facet 21, thereby attaining the emission of a laser light at a selected wavelength from the facet 21.

The semiconductor laser device in this Example attained laser oscillation in a single longitudinal mode at an oscillation wavelength of 8253 Å at a threshold current of 35 mA, wherein mode hopping, etc., did not occur in the range from 0° C. to 50° C. and a temperature dependent variation of wavelength was as small as 0.6 Å/° C. Moreover, no modal noise occurred even though the backlight to the front facet 21 existed to an extent of about 2%.

Figure 3:
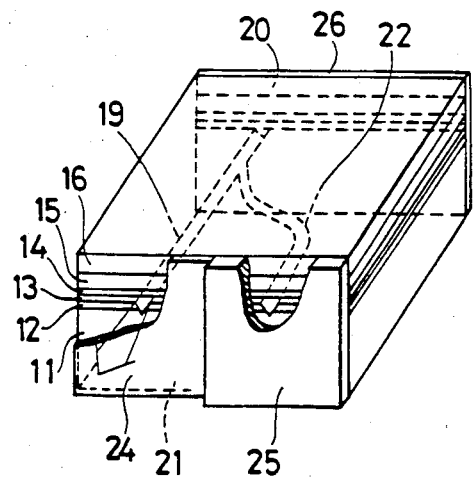
FIG. 3 is a perspective view of another compound resonator type semiconductor laser device according to this invention.

FIG. 3 shows another compound resonator type semiconductor laser device, wherein the facet in the second laser operation area 22 shown in FIG. 1 is formed on the same cleaved facet as the front facet 21 in the first laser operation area 19. The resonator of the first laser operation area 19 is formed in a rectilinear shape from the back facet 20 to the front facet 21, while the resonator of the second laser operation area 22 is formed in a curved shape from the back facet 20 to the facet on the same cleaved facet as the front facet 21 in the first laser operation area 19 through the branching portion in the middle of the resonator of the first laser operation area 19. Thus, a portion of the front facet 21 corresponding to one of the facets of the resonator in the first laser operation area 19 and the other portion of the front facet 21 corresponding to one of the facets of the resonator in the second laser operation area 22 are covered with a protective film 24 of $Al_2O_3$ having a low refractive index and a protective laminated film 25 composed of four alternate layers of an $Al_2O_3$ film and an a-Si film having a high refractive index, respectively, and the other facet 20 is covered with the same protective film 26 having a high refractive index as that shown in FIG. 1, resulting in a compound resonator type semiconductor laser device which exhibits the same characteristics as that shown in FIG. 1.

2. Frequency modulating semiconductor laser devices:

The compound resonator type semiconductor laser device of this invention can be utilized as a frequency modulating semiconductor laser device in the case where the second laser operation area functions as a modulation area.

Each of the facets of the resonator in the laser operation area and of the resonator in the modulation area in which one of the facets is common to one of the facets in the laser operation area is covered with a dielectric film to thereby have a selected reflectivity. A low reflectivity is selected for one of the facets of the resonator in the laser operation area oscillating a laser light, while a high reflectivity is selected for the other facet of the resonator in the laser operation area and for both facets of the resonator in the modulation area, one of which is common to the other facet in the laser operation area. The facet requiring a low reflectivity ranging from 0 to approximately 0.32 and each of the facets requiring a high reflectivity ranging from 0.32 to 1.00 are covered respectively with of $SiO_2$, $Al_2O_3$ or the like having a thickness of $\lambda/4$ to $\lambda/2$, and a lamination composed of two or four alternate layers of a dielectric film such as $SiO_2$, $Al_2O_3$ or the like and an a-Si film having a thickness of $\lambda/4$ each, in the same manner as described above with respect to FIGS. 1–3.

A driving current is injected into the laser operation area to begin laser oscillation operation by the resonator therein while a modulating current is injected into the modulation area to begin laser oscillation operation by the resonator therein, as well. Since both facets of the resonator in the modulation area have a high reflectivity, most of the laser light is confined within the resonator without oscillating to the outside so that the internal photon density thereof increases, while one of the facets of the resonator in the laser operation area has a low reflectivity, a large portion of the laser light is released so that the internal photon density thereof is reduced. Thus, a portion (having the resonator length of $L_1$) of the resonator in the laser operation area which is common to that in the modulation area has a high photon density $P_1$ and the other portion (having the resonator length of $L_2$) of the resonator in the laser operation area alone has a low photon density $P_2$. This means that the resonator in the laser operation area has a waveguide having different photon densities. Given that a gain in the resonator portion having a high photon density is $g_1$ and a gain in the other resonator portion having a low photon density is $g_2$, the effective gain geff in the resonator of the laser operation area is represented by the equation:

$$geff=(g_1P_1L_1+g_2P_2L_2)/(P_1L_1+P_2L_2)$$

Since the oscillation wavelength $\lambda$ depends upon the geff, the wavelength or the frequency of the laser light which is oscillated from the laser operation area can be modulated by the control of the photon density $P_1$ under the modulating current to the modulation area.

The above-mentioned structure can attain an excellent modulation effect, i.e., a high modulation degree, by the control of the photon density, thereby allowing the ready modulation of frequency of the laser light oscillated therefrom. Moreover, the possible modulation range is greatly enlarged depending upon an allowable variation value of the photon density. Thus, the resulting semiconductor laser device has extremely excellent characteristics as a light source for optical communication in the FM format.

Example

Figure 4:
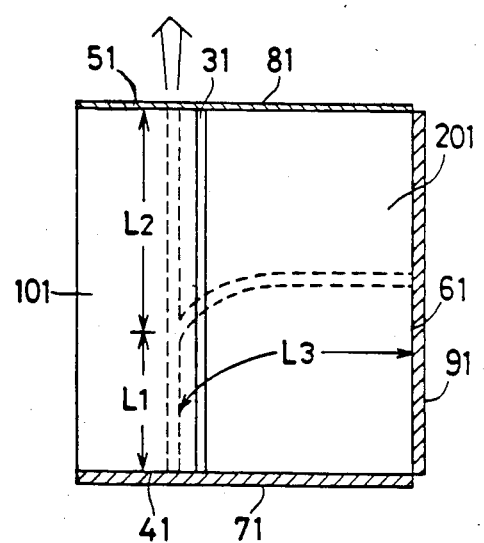
FIG. 4 is a plan view of a frequency modulating semiconductor laser device according to this invention.
Figure 5:
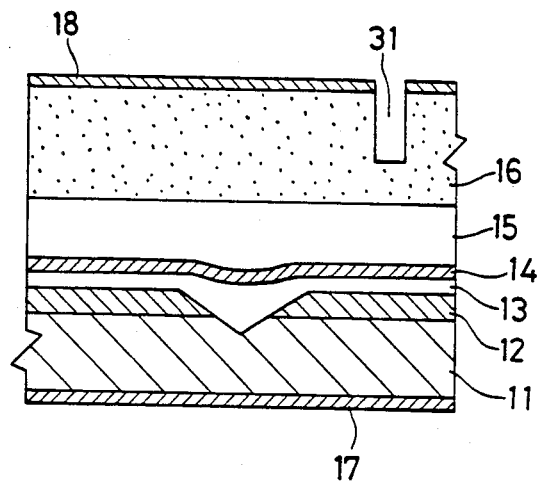
FIG. 5 is a partial sectional front view of the semiconductor laser device shown in FIG. 4.
Figure 9:
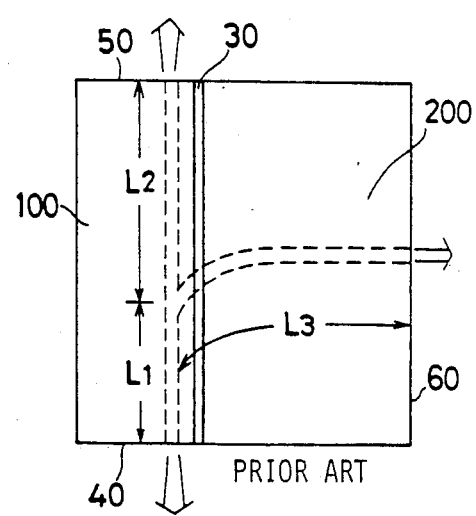
FIG. 9 is a perspective view of a conventional frequency modulating semiconductive laser device.

FIGS. 4 and 5 show a frequency modulating semiconductor laser device, which comprises the laser operation area 101 and the modulation area 201 in the same manner as that shown in FIG. 9. The laser operation area 101 is electrically separated from the modulation area 201 by a separation groove 31 which is formed in at least one of the electrodes 17 and 18. The laser operation area 101 contains a rectilinear resonator with the resonator length $(L_1+L_2)$ which is composed of a front facet 51 for releasing a laser light and a back facet 41 facing the front facet 51. The modulation area 201 contains an L-shaped resonator for controlling the photon density thereof to modulate the frequency. The L-shaped resonator with the resonator length $(L_1+L_3)$ is composed of a side facet 61 at a right angle to the front facet 51 in the laser operation area 101 and the back facet 41 which is common to the resonator in the laser operation area 101. Both resonators have a common portion having the resonator length $L_1$ from the back facet 41. Each of the resonators is preferably of a refractive index waveguide type which is advantageous over a gain waveguide type in that a single longitudinal mode can be readily attained. The facets 41, 51 and 61 are covered with protective films 71, 81 and 91, respectively, to effect a selected reflectivity in each of these facets. The front facet 51 for releasing a laser light is covered with a single film of $Al_2O_3$ having a thickness of $\lambda/2$ ($\lambda$ is the oscillation wavelength) by an electron beam vapor deposition method, resulting in a reflectivity of as low as approximately 0.30. Each of the other facets 41 and 61 is covered with a lamination consisting of four alternate layers of an $Al_2O_3$ film and an a-Si film having a thickness of $\lambda/4$ each by an electron beam vapor deposition method, resulting in a reflectivity of as high as approximately 0.95.

A VSIS laser device of a refractive index waveguide type of this invention shown in FIGS. 4 and 5 is produced in the same manner as that shown in FIGS. 1 and 2 except that the concaved active layer 14 is formed.

When a DC current is injected into the resulting laser device through the electrode 17 and 18, the current flows through the striped channel in the GaAs substrate 11 to allow laser oscillation in the laser operation area 101 at the upper portion corresponding to the striped channel. A concentrated laser light is released in a spotlight fashion in the stabilized transverse mode from the facet depending upon the reflectivity thereof.

Figure 6:
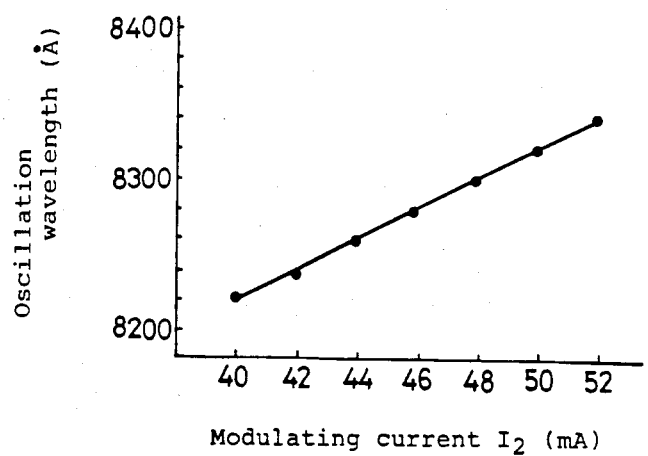
FIG. 6 is a characteristic curve showing the relationship between the modulating current $I_2$ and the oscillation wavelength.

When a driving current $I_1$ was injected into the laser operation area 101, a laser light was oscillated at an oscillation wavelength of 8190 Å at a threshold current of 35 mA from the front facet 51 having a low reflectivity. When a modulating current $I_2$ was injected into the modulation area 201 to change the current level from 40 mA to 52 mA, the internal photon density, which is high due to the high reflectivity in each of the facets 41 and 61 of the resonator in the modulation area 201, varied depending upon the current $I_2$, resulting in an interference in the resonator of the laser operation area 101 so that a laser light was generated at an oscillation wavelength $\lambda$ with a continuous variation in the range of from 8220 Å to 8340 Å as shown in FIG. 6. Thus, the frequency modulating semiconductor laser device attained an enlarged wavelength modulation range to the extent of 120 Å (5300 GHz) and a high modulation degree of 10 Å/mA (450 GHz/mA).

Figure 7:
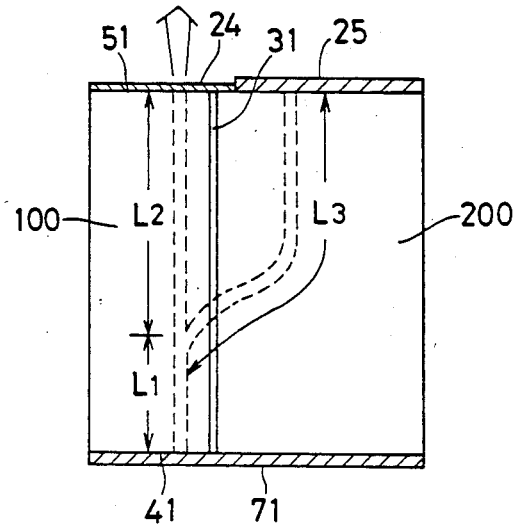
FIG. 7 is a plan view of another frequency modulating semiconductor laser device according to this invention.

FIG. 7 shows another frequency modulating semiconductor laser device, wherein the facet in the modulation area 201 shown in FIG. 4 is formed on the same cleaved facet as the front facet 51 in the laser operation area 101. The resonator in the laser operation area 101 is formed in a rectilinear shape from the back facet 41 to the front facet 51, while the resonator in the modulation area 201 is formed in a curved shape from the back facet 41 to the facet on the same cleaved facet as the front facet 51 in the laser operation area 101 through the branching portion in the middle of the resonator in the laser operation area 101. Thus, a portion of the facet 51 corresponding to the facet of the resonator in the laser operation area 101 and the other portion of the facet 51 corresponding to the facet of the resonator in the modulation area 201 are covered with a protective film 24 of $Al_2O_3$ having a low refractive index and a protective laminated film 25 composed of four alternate layers of an $Al_2O_3$ film and an a-Si film having a high refractive index, respectively, and the other facet 41 is covered with the same protective film 71 having a high refractive index as that shown in FIG. 4, resulting in a frequency modulating semiconductor laser device which exhibits the same characteristics as that shown in FIG. 4.

Any of these semiconductor laser devices according to this invention are not limited to the GaAs-GaAlAs systems, but they can be applied to semiconductor materials of an InP-InGaAsP system and/or other compound semiconductors. An optical guide layer or the like can be used for the waveguide constituting a resonator.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty which reside in the present invention, including all features which would be treated as equivalents thereof by those skilled in the art to which this invention pertains.

What is claimed is:

1. In a compound resonator type semiconductor laser device comprising: a multiple-layered crystal structure having a first laser operation area which contains a resonator for laser oscillation and a second laser operation area which contains a resonator, a facet of which is shared with that of the resonator in the first laser operation area; and an electric current feeder for injecting a current into said multiple-layered crystal structure; the improvement wherein: said facet of the resonator in the first laser operation area, which is shared with the facet of the resonator in the second laser operation area, is covered with a protective film to attain a high reflectivity therein, the other facet of the resonator in the first laser operation area is covered with a protective film to attain a low reflectivity therein and the other facet of the resonator in the second laser operation area is covered with a protective film to attain a high reflectivity therein.

2. A compound resonator type semiconductor laser device according to claim 1, wherein said protective film attaining a high reflectivity is a lamination composed of alternate layers of a dielectric film and an amorphous silicon film having a thickness of $\lambda/4$ each and said protective films attaining a low reflectivity is a single layer of a dielectric film having a thickness in the range from $\lambda/4$ to $\lambda/2$.

3. A compound resonator type semiconductor laser device according to claim 2, wherein said dielectric film is made of $SiO_2$ or $Al_2O_3$.

4. A compound resonator type semiconductor laser device according to claim 1, wherein the second laser operation area functions as a modulation area for the modulating frequency.

5. A compound resonator type semiconductor laser device according to claim 4, wherein a separation groove is disposed in at least one of the upper and the bottom electrodes formed on said multiple-layered crystal structure to electrically separate said laser operation area from said modulation area.

* * * * *